US012676590B2

(12) United States Patent
Watanabe et al.

(10) Patent No.: US 12,676,590 B2
(45) Date of Patent: Jul. 7, 2026

(54) ACOUSTIC WAVE DEVICE

(71) Applicant: Murata Manufacturing Co., Ltd., Nagaokakyo (JP)

(72) Inventors: Munehisa Watanabe, Nagaokakyo (JP); Katsuya Daimon, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 879 days.

(21) Appl. No.: 17/969,731

(22) Filed: Oct. 20, 2022

(65) Prior Publication Data

US 2023/0040371 A1     Feb. 9, 2023

Related U.S. Application Data

(63) Continuation of application No. PCT/JP2021/016309, filed on Apr. 22, 2021.

(30) Foreign Application Priority Data

Apr. 27, 2020   (JP) ................................. 2020-078148

(51) Int. Cl.
    *H03H 9/02*        (2006.01)
    *H03H 9/145*       (2006.01)
    *H03H 9/25*        (2006.01)
(52) U.S. Cl.
    CPC .... *H03H 9/02818* (2013.01); *H03H 9/02842* (2013.01); *H03H 9/145* (2013.01); *H03H 9/25* (2013.01)
(58) Field of Classification Search
    CPC ...... H03H 9/25; H03H 9/02574; H03H 9/145; H03H 9/02818; H03H 9/1457; H03H 9/02842
    See application file for complete search history.

(56) References Cited

U.S. PATENT DOCUMENTS 7,939,989 B2 *  5/2011  Solal ..................... H03H 9/1452
                                                310/313 C
12,425,003 B2 *  9/2025  Taniguchi .............. H03H 9/145
        (Continued)

FOREIGN PATENT DOCUMENTS

CN        109698681 A      4/2019
CN        109802650 A      5/2019
        (Continued)

OTHER PUBLICATIONS

Official Communication issued in corresponding Chinese Patent Application No. 202180029551.9, mailed on May 16, 2025, 6 pages.

(Continued)

*Primary Examiner* — J. San Martin
(74) *Attorney, Agent, or Firm* — Keating & Bennett, LLP

(57)     ABSTRACT

An acoustic wave device includes a piezoelectric substrate and an IDT electrode. The IDT electrode includes a center area and first and second edge areas. Areas including the first and second edge areas and overlapping the areas in an acoustic-wave propagation direction include first and second expansion edge areas. First and second acoustic-velocity adjusters are provided in the first and second expansion edge areas. The first and second acoustic-velocity adjusters respectively includes first and second end portions and third and fourth end portions. The first to fourth end portions are located at outer sides of the first and second edge areas. End portions in at least one of two pairs including a pair of first and third end portions and a pair of second and fourth end portions do not overlap each other in a direction in which electrode fingers extend.

13 Claims, 9 Drawing Sheets

(56)            References Cited

U.S. PATENT DOCUMENTS

| | | | |
|---|---|---|---|
| 2013/0051588 A1* | 2/2013 | Ruile .................. | H03H 9/1457 |
| | | | 29/25.35 |
| 2013/0249647 A1 | 9/2013 | Nakanishi et al. | |
| 2016/0065176 A1* | 3/2016 | Taniguchi ........... | H03H 9/6426 |
| | | | 333/195 |
| 2016/0072475 A1* | 3/2016 | Mimura ............. | H03H 9/02992 |
| | | | 333/195 |
| 2016/0182010 A1 | 6/2016 | Nakamura et al. | |
| 2017/0047905 A1* | 2/2017 | Araki ................ | H03H 9/02535 |
| 2018/0102761 A1 | 4/2018 | Takai et al. | |
| 2019/0123713 A1 | 4/2019 | Daimon | |
| 2019/0149128 A1 | 5/2019 | Saji et al. | |
| 2020/0212891 A1 | 7/2020 | Daimon | |
| 2020/0304092 A1 | 9/2020 | Suzuki et al. | |
| 2020/0403603 A1* | 12/2020 | Daimon ............. | H03H 9/14573 |
| 2021/0126616 A1* | 4/2021 | Hiramatsu ......... | H03H 9/14541 |
| 2021/0351760 A1* | 11/2021 | Takigawa ................ | H03H 1/00 |
| 2023/0041470 A1* | 2/2023 | Taniguchi ............... | H03H 9/25 |
| 2024/0223154 A1* | 7/2024 | Oshima .............. | H03H 9/02637 |

FOREIGN PATENT DOCUMENTS

| | | | |
|---|---|---|---|
| JP | 2016119569 A | | 6/2016 |
| JP | 2016184951 A | | 10/2016 |
| JP | 2018182544 A | * | 11/2018 |
| JP | 2019068309 A | | 4/2019 |
| KR | 20170128505 A | | 11/2017 |
| WO | 2016047255 A1 | | 3/2016 |
| WO | 2019059208 A1 | | 3/2019 |
| WO | 2019123810 A1 | | 6/2019 |

OTHER PUBLICATIONS

International Search Report in PCT/JP2021/016309, mailed Jun. 29, 2021, 3 pages.
Written Opinion in PCT/JP2021/016309, mailed Jun. 29, 2021, 5 pages.

* cited by examiner

ACOUSTIC WAVE DEVICE

CROSS REFERENCE TO RELATED APPLICATIONS

This application claims the benefit of priority to Japanese Patent Application No. 2020-078148 filed on Apr. 27, 2020 and is a Continuation Application of PCT Application No. PCT/JP2021/016309 filed on Apr. 22, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices have widely been used as filters for mobile phones. Japanese Unexamined Patent Application Publication No. 2019-068309 discloses an example of an acoustic wave device. The acoustic wave device includes an interdigital transducer (IDT) electrode on a piezoelectric substrate. The acoustic wave device also includes a silicon oxide film disposed on the piezoelectric substrate to cover the IDT electrode. In a plan view, a mass loading film is disposed on the silicon oxide film to overlap distal end portions of multiple electrode fingers of the IDT electrode. The acoustic wave device in Japanese Unexamined Patent Application Publication No. 2019-068309 establishes a piston mode to enable a reduction of spurious responses caused by a transverse mode. However, the acoustic wave device in Japanese Unexamined Patent Application Publication No. 2019-068309 is not suitable to reduce or prevent a higher-order mode.

SUMMARY OF THE INVENTION

Preferred embodiments of the present invention provide acoustic wave devices that are each able to reduce or prevent a transverse mode and a higher-order mode.

An acoustic wave device according to a preferred embodiment of the present invention includes a piezoelectric substrate, an interdigital transducer (IDT) electrode on the piezoelectric substrate and including a plurality of electrode fingers, and a first reflector and a second reflector on the piezoelectric substrate on both sides of the IDT electrode in an acoustic-wave propagation direction. A portion of the IDT electrode at which each two of the electrode fingers adjacent to each other overlap in the acoustic-wave propagation direction defines and functions as an intersecting area, the intersecting area includes a center area at or around a center portion in a direction in which the plurality of electrode fingers extend, and a pair of edge areas on both sides of the center area in the direction in which the plurality of electrode fingers extend. Areas including the pair of edge areas and overlapping the pair of edge areas in the acoustic-wave propagation direction define and function as a pair of expansion edge areas. A pair of acoustic-velocity adjusters are provided in the pair of expansion edge areas, and an acoustic velocity in the pair of acoustic-velocity adjusters is lower than an acoustic velocity in the center area. One acoustic-velocity adjuster of the pair of acoustic-velocity adjusters includes a first end portion located closer to the first reflector and a second end portion located closer to the second reflector. Another acoustic-velocity adjuster in the pair of acoustic-velocity adjusters includes a third end portion located closer to the first reflector and a fourth end portion located closer to the second reflector. The first end portion, the second end portion, the third end portion, and the fourth end portion are located at outer sides of the pair of edge areas in the acoustic-wave propagation direction. End portions in at least one pair of two pairs including a pair of the first end portion and the third end portion and a pair of the second end portion and the fourth end portion do not overlap each other in the direction in which the plurality of electrode fingers extend.

The acoustic wave devices according to preferred embodiments of the present invention are each able to reduce or prevent a transverse mode and a higher-order mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is described below with reference to the drawings by describing specific preferred embodiments of the present invention.

Each preferred embodiment of the present invention described herein is merely an example. Components in different preferred embodiments may be partially replaced between each other or combined with each other.

Figure 1:
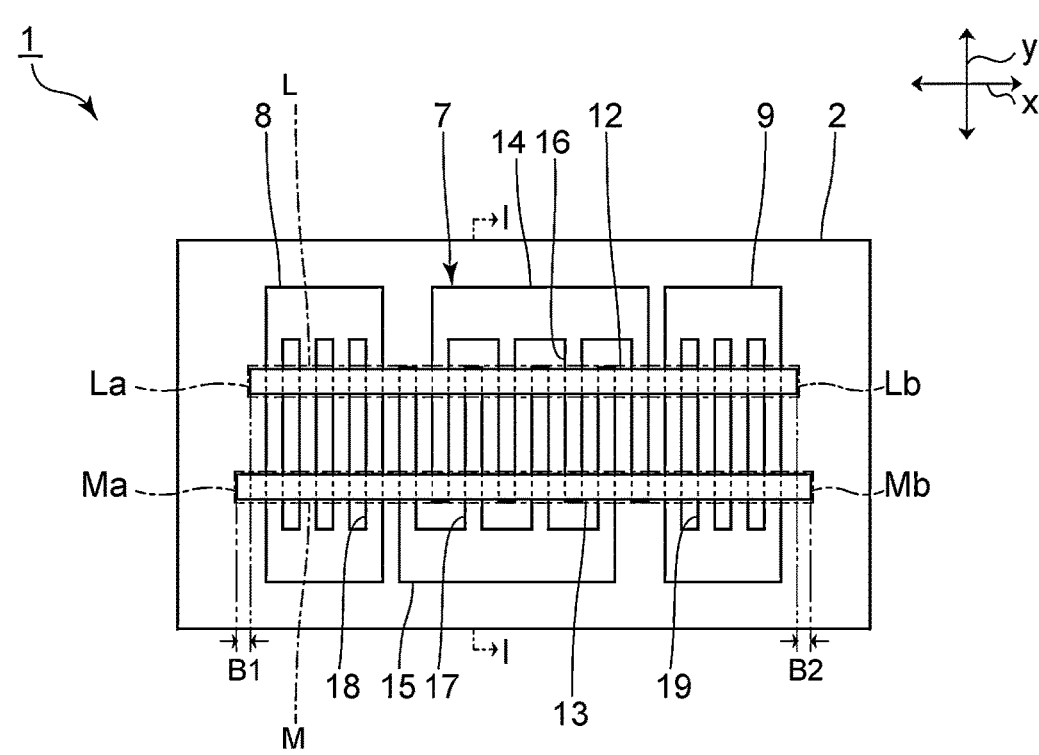
FIG. 1 is a plan view of an acoustic wave device according to a first preferred embodiment of the present invention.

FIG. 1 is a plan view of an acoustic wave device according to a first preferred embodiment of the present invention.

An acoustic wave device 1 establishes a piston mode to reduce or prevent a transverse mode. The acoustic wave device 1 includes a piezoelectric substrate 2. An interdigital transducer (IDT) electrode 7 is disposed on the piezoelectric substrate 2. The IDT electrode 7 includes multiple electrode fingers. The IDT electrode 7 includes a center area C, a first edge area E1, and a second edge area E2. The first edge area E1 and the second edge area E2 include distal ends of the multiple electrode fingers. In the acoustic wave device 1, the first edge area E1 and the second edge area E2 extend to outer sides of the IDT electrode 7. These areas are a first expansion edge area Ex1 and a second expansion edge area Ex2. In the first expansion edge area Ex1 and the second expansion edge area Ex2, a first acoustic-velocity adjuster L and a second acoustic-velocity adjuster M are disposed. This structure establishes a piston mode.

The first acoustic-velocity adjuster L includes a first end portion La and a second end portion Lb. The second acoustic-velocity adjuster M includes a third end portion Ma and a fourth end portion Mb. The present preferred embodiment is characterized in that the acoustic wave device 1 has the following structure: 1) the first acoustic-velocity adjuster L is disposed in the first expansion edge area Ex1, and the second acoustic-velocity adjuster M is disposed in the second expansion edge area Ex2; and 2) end portions in at least one of two pairs including a pair of the first end portion La and the third end portion Ma and a pair of the second end portion Lb and the fourth end portion Mb do not overlap each other in a direction in which the multiple electrode fingers extend. Thus, the acoustic wave device 1 can reduce or prevent the higher-order mode in addition to the transverse mode. The above advantageous effects will be described below in detail together with the structure of the present preferred embodiment.

Figure 2:
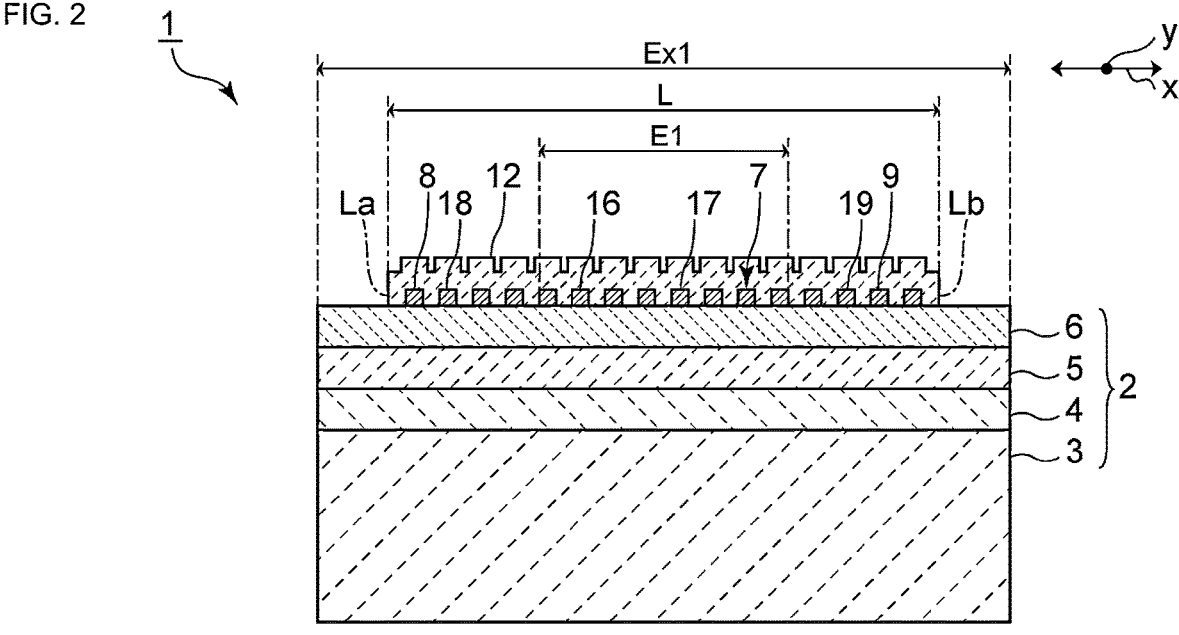
FIG. 2 is a cross-sectional view of the acoustic wave device according to the first preferred embodiment of the present invention, taken along a first expansion edge area.

FIG. 2 is a cross-sectional view of the acoustic wave device according to the first preferred embodiment, taken along the first expansion edge area.

As illustrated in FIG. 2, the piezoelectric substrate 2 includes a support substrate 3, a high acoustic-velocity film 4 defining and functioning as a high acoustic-velocity material layer, a low acoustic-velocity film 5, and a piezoelectric layer 6. More specifically, the high acoustic-velocity film 4 is disposed on the support substrate 3. The low acoustic-velocity film 5 is disposed on the high acoustic-velocity film 4. The piezoelectric layer 6 is disposed on the low acoustic-velocity film 5.

The IDT electrode 7 is disposed on the piezoelectric layer 6 of the piezoelectric substrate 2. An application of an alternating-current (AC) voltage to the IDT electrode 7 excites an acoustic wave. As illustrated in FIG. 2, a pair of reflectors are disposed on the piezoelectric substrate 2 on both sides of the IDT electrode 7 in the acoustic-wave propagation direction. More specifically, the pair of reflectors include a first reflector 8 and a second reflector 9. As described above, the acoustic wave device 1 according to the present preferred embodiment is, for example, a surface acoustic wave resonator. The acoustic wave device according to the present invention is not limited to an acoustic wave resonator, and may be, for example, a filtering device or a multiplexer including an acoustic wave resonator.

As illustrated in FIG. 1, the IDT electrode 7 includes a first busbar 14, a second busbar 15, multiple first electrode fingers 16, and multiple second electrode fingers 17. The first busbar 14 and the second busbar 15 face each other. First ends of the multiple first electrode fingers 16 are connected to the first busbar 14. First ends of the multiple second electrode fingers 17 are connected to the second busbar 15. The multiple first electrode fingers 16 and the multiple second electrode fingers 17 are interdigitated with each other. Herein, the acoustic-wave propagation direction corresponds to an x direction. The direction in which the first electrode fingers 16 and the second electrode fingers 17 extend corresponds to a y direction. In the present preferred embodiment, the x direction and the y direction are perpendicular or substantially perpendicular to each other.

The first reflector 8 includes multiple electrode fingers 18. The second reflector 9 includes multiple electrode fingers 19. Herein, the first electrode fingers 16 and the second electrode fingers 17 of the IDT electrode 7, the electrode fingers 18 of the first reflector 8, and the electrode fingers 19 of the second reflector 9 may be collectively referred to as electrode fingers. The IDT electrode 7, the first reflector 8, and the second reflector 9 are made of an appropriate metal. The IDT electrode 7, the first reflector 8, and the second reflector 9 may be made of a laminate metal film or a single-layer metal film.

Examples of the material of the piezoelectric layer 6 illustrated in FIG. 2 may include a lithium tantalate, a lithium niobate, a zinc oxide, an aluminum nitride, a quartz, and a lead zirconate titanate (PZT).

The low acoustic-velocity film 5 has a relatively low acoustic velocity. More specifically, the acoustic velocity of bulk waves that propagate through the low acoustic-velocity film 5 is lower than the acoustic velocity of bulk waves that propagate through the piezoelectric layer 6. Examples of the material of the low acoustic-velocity film 5 may include glass, a silicon oxide, a silicon oxynitride, a lithium oxide, a tantalum pentoxide, and a material including, as a main component, a compound obtained by adding fluorine, carbon, or boron to a silicon oxide.

In the present preferred embodiment, the high acoustic-velocity material layer is the high acoustic-velocity film 4. The high acoustic-velocity material layer has a relatively high acoustic velocity. More specifically, the acoustic velocity of bulk waves that propagate through the high acoustic-velocity material layer is higher than the acoustic velocity of acoustic waves that propagate through the piezoelectric layer 6. Examples of the material of the high acoustic-velocity film 4 include a medium including a material, as a main component, such as silicon, an aluminum oxide, a silicon carbide, a silicon nitride, a silicon oxynitride, sapphire, a lithium tantalate, a lithium niobate, a quartz, alumina, zirconia, cordierite, mullite, steatite, forsterite, magnesia, a diamondlike carbon (DLC) film, or diamond.

Examples of the material of the support substrate 3 include a piezoelectric material such as an aluminum oxide, a lithium tantalate, a lithium niobate, or a quartz, ceramics such as alumina, sapphire, magnesia, a silicon nitride, an aluminum nitride, a silicon carbide, zirconia, cordierite, mullite, steatite, or forsterite, a dielectric material such as diamond or glass, a semiconductor material such as silicon or a gallium nitride, and a resin.

In the present preferred embodiment, the piezoelectric substrate 2 includes the high acoustic-velocity film 4 defining and functioning as a high acoustic-velocity material layer, the low acoustic-velocity film 5, and the piezoelectric layer 6 laminated in this order. Thus, the piezoelectric substrate 2 can effectively trap the energy of the acoustic wave in the piezoelectric layer 6.

A protective film may be provided on the piezoelectric substrate 2 to cover the IDT electrode 7, the first reflector 8, and the second reflector 9. In this case, the IDT electrode 7, the first reflector 8, the second reflector 9 are less easily broken. Examples of materials of the protective film include a dielectric material such as a silicon oxide, a silicon nitride, and a silicon oxynitride.

Figures 3, 4:
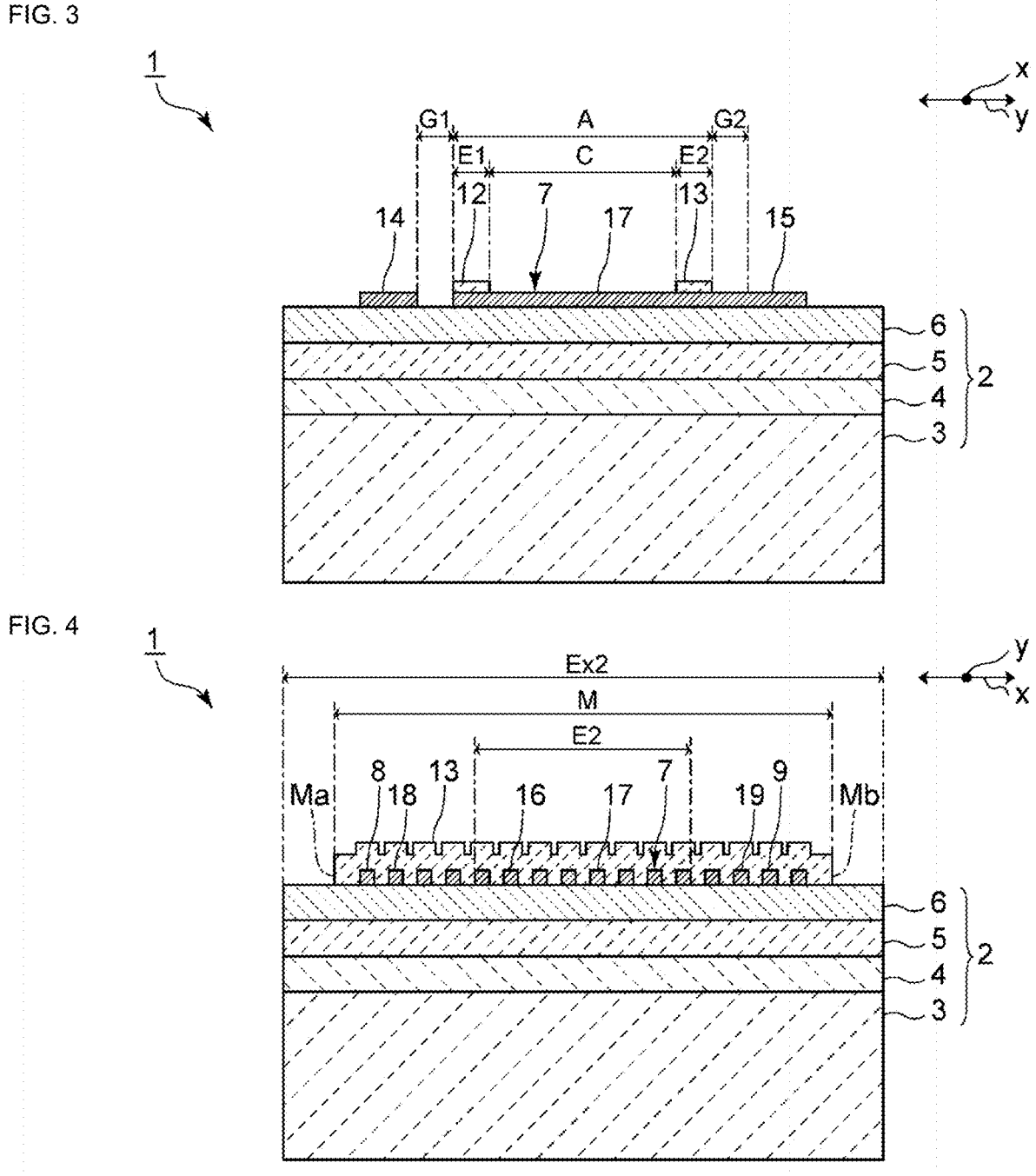
FIG. 3 is a cross-sectional view taken along line I-I in FIG. 1.
FIG. 4 is a cross-sectional view of the acoustic wave device according to the first preferred embodiment of the present invention, taken along a second expansion edge area.
Figure 5:
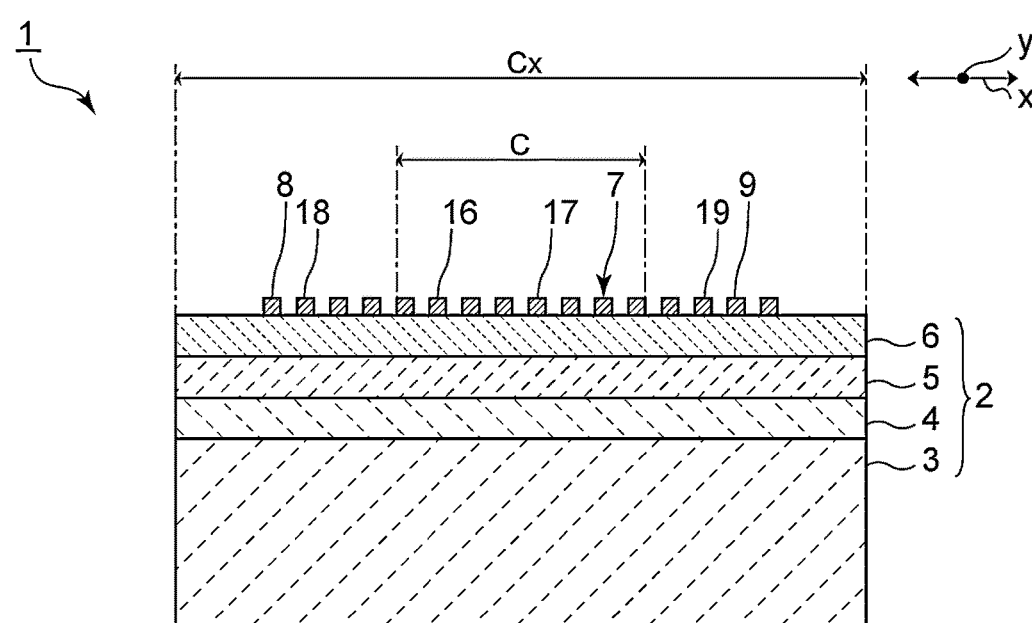
FIG. 5 is a cross-sectional view of the acoustic wave device according to the first preferred embodiment of the present invention, taken along a center area.

FIG. 3 is a cross-sectional view taken along line I-I in FIG. 1. FIG. 4 is a cross-sectional view of the acoustic wave device according to the first preferred embodiment, taken along a second expansion edge area. FIG. 5 is a cross-sectional view of the acoustic wave device according to the first preferred embodiment, taken along a center area.

As illustrated in FIG. 1 and FIG. 3, a portion of the IDT electrode 7 where the first electrode fingers 16 and the second electrode fingers 17 overlap in the x direction is an intersecting area A. The intersecting area A includes a center area C and a pair of edge areas. More specifically, the pair of edge areas include the first edge area E1 and the second edge area E2. The center area C is located at or around a center portion in the intersecting area A in the y direction. The first edge area E1 and the second edge area E2 are disposed on both sides of the center area C in the y direction. More specifically, the first edge area E1 is disposed at a side of the center area C closer to the first busbar 14. The second edge area E2 is disposed at a side of the center area C closer to the second busbar 15.

The IDT electrode 7 includes a first gap area G1 and a second gap area G2. The first gap area G1 is located between the first edge area E1 and the first busbar 14. The second gap area G2 is located between the second edge area E2 and the second busbar 15. Among the first electrode fingers 16 and the second electrode fingers 17, only the first electrode fingers 16 are disposed in the first gap area G1. Thus, the acoustic velocity in the first gap area G1 is higher than the acoustic velocity in the center area C. Similarly, among the first electrode fingers 16 and the second electrode fingers 17, only the second electrode fingers 17 are disposed in the second gap area G2. Thus, the acoustic velocity in the second gap area G2 is higher than the acoustic velocity in the center area C. When the acoustic velocity in the center area C is denoted with $V_c$ and the acoustic velocity in the first gap area G1 and the second gap area G2 is denoted with $V_g$, $V_c < V_g$. Thus, the first gap area G1 and the second gap area G2 form high acoustic-velocity areas.

Areas including the pair of edge areas and overlapping the pair of edge areas in the acoustic-wave propagation direction are a pair of expansion edge areas. More specifically, as illustrated in FIG. 2, an area including the first edge area E1 and overlapping the first edge area E1 in the x direction is the first expansion edge area Ext. As illustrated in FIG. 4, an area including the second edge area E2 and overlapping the second edge area E2 in the x direction is the second expansion edge area Ex2. On the other hand, as illustrated in FIG. 5, an area including the center area C and overlapping the center area C in the x direction is an expansion center area Cx.

Referring back to FIG. 1, a pair of acoustic-velocity adjusters are disposed in the pair of expansion edge areas. More specifically, the first acoustic-velocity adjuster L is disposed in the first expansion edge area Ex1, and the second acoustic-velocity adjuster M is disposed in the second expansion edge area Ex2.

The first acoustic-velocity adjuster L extends to outer sides of the first reflector 8 and the second reflector 9 in the x direction. The acoustic velocity in the first acoustic-velocity adjuster L is lower than the acoustic velocity in the center area C. In the present preferred embodiment, the first acoustic-velocity adjuster L is defined by a mass loading film 12. The mass loading film 12 has, for example, a belt shape. One mass loading film 12 is provided on all of the electrode fingers of the IDT electrode 7, the first reflector 8, and the second reflector 9. The mass loading film 12 is also disposed, on the piezoelectric substrate 2, at portions between the multiple electrode fingers, a portion between the IDT electrode 7 and the first reflector 8, and a portion between the IDT electrode 7 and the second reflector 9. The direction in which the first acoustic-velocity adjuster L extends and the x direction are parallel or substantially parallel to each other.

The second acoustic-velocity adjuster M extends to outer sides of the first reflector 8 and the second reflector 9 in the x direction. The acoustic velocity in the second acoustic-velocity adjuster M is lower than the acoustic velocity in the center area C. In the present preferred embodiment, the second acoustic-velocity adjuster M is defined by a mass loading film 13. The mass loading film 13 has, for example, a belt shape. One mass loading film 13 is disposed on all of the electrode fingers of the IDT electrode 7, the first reflector 8, and the second reflector 9. The mass loading film 13 is also disposed, on the piezoelectric substrate 2, at portions between the multiple electrode fingers, a portion between the IDT electrode 7 and the first reflector 8, and a portion between the IDT electrode 7 and the second reflector 9. The direction in which the second acoustic-velocity adjuster M extends and the x direction are parallel or substantially parallel to each other. For example, an appropriate dielectric material may be used for the mass loading film 12 and the mass loading film 13.

The first acoustic-velocity adjuster L includes a first end portion La and a second end portion Lb. The first end portion La is located closer to the first reflector 8. The second end portion Lb is located closer to the second reflector 9. The second acoustic-velocity adjuster M includes a third end portion Ma and a fourth end portion Mb. The third end portion Ma is located closer to the first reflector 8. The fourth end portion Mb is located closer to the second reflector 9. In the present preferred embodiment, the first end portion La, the second end portion Lb, the third end portion Ma, and the fourth end portion Mb are located at outer sides of the pair of reflectors in the x direction.

The first end portion La, the second end portion Lb, the third end portion Ma, and the fourth end portion Mb may be disposed at any positions at the outer sides of the IDT electrode 7 in the x direction. This structure can further lower the acoustic velocity in the pair of edge areas than the acoustic velocity in the center area C.

In the present preferred embodiment, the areas are provided in the y direction in order of the center area C, the pair of acoustic-velocity adjusters, and the pair of high acoustic-velocity areas. This structure can thus establish the piston mode, and reduce or prevent the transverse mode.

In this case, the dimension of each acoustic-velocity adjuster in the direction in which the acoustic-velocity adjuster extends is defined as the length of the acoustic-velocity adjuster. The second acoustic-velocity adjuster M is longer than the first acoustic-velocity adjuster L. More specifically, the third end portion Ma is located at the outer side of the first end portion La in the x direction. The fourth end portion Mb is located at the outer side of the third end portion Lb in the x direction. Thus, in the present preferred embodiment, the first end portion La and the third end portion Ma do not overlap in the y direction, and the second end portion Lb and the fourth end portion Mb do not overlap in the y direction. This structure can thus reduce or prevent the higher-order mode. This will be described below.

The main mode resonates in the area where the IDT electrode 7 and the pair of reflectors are located. Thus, most of the energy of the main mode concentrates on the area where the IDT electrode 7 and the pair of reflectors are located. On the other hand, the higher-order mode resonates in the thickness direction of the piezoelectric layer 6. Thus, the higher-order mode resonates also at the outer side of the area where the IDT electrode 7 and the pair of reflectors are located. The higher-order mode resonates in an area surrounded by a line connecting the first end portion La of the first acoustic-velocity adjuster L, the second end portion Lb of the first acoustic-velocity adjuster L, the third end portion Ma of the second acoustic-velocity adjuster M, and the fourth end portion Mb of the second acoustic-velocity adjuster M. This area is defined as a higher-order-mode resonance area. Also in the case where the first acoustic-velocity adjuster L and the second acoustic-velocity adjuster M extend to the outer sides of the pair of reflectors in the x direction, the higher-order mode resonates in the higher-order-mode resonance area. When the first end portion La and the third end portion Ma overlap in the y direction and the second end portion Lb and the fourth end portion Mb overlap in the y direction, the higher-order mode uniformly resonates in the higher-order-mode resonance area. In this case, the phase of the higher-order mode is uniform or substantially uniform in the higher-order-mode resonance area. Thus, large spurious responses result from the higher-order mode.

In contrast, in the present preferred embodiment, the first end portion La and the third end portion Ma do not overlap in the y direction, and the second end portion Lb and the fourth end portion Mb do not overlap in the y direction. Thus, the phase in the higher-order mode in the higher-order-mode resonance area can be shifted. Resonance in the higher-order mode can thus be reduced or prevented. Thus, the acoustic wave device 1 can reduce or prevent the higher-order mode in addition to the transverse mode.

End portions in at least one of two pairs including the pair of the first end portion La and the third end portion Ma and the pair of the second end portion Lb and the fourth end portion Mb may be arranged to avoid overlapping each other in the y direction. The acoustic wave device 1 with this structure can reduce or prevent the transverse mode and the higher-order mode.

As illustrated in FIG. 1, the distance between the first end portion La and the third end portion Ma when viewed in the y direction is denoted with B1. The distance B1 is an x-direction component of the distance between the first end portion La and the third end portion Ma. The distance between the second end portion Lb and the fourth end portion Mb when viewed in the y direction is denoted with B2. The distance B2 is an x-direction component of the distance between the second end portion Lb and the fourth end portion Mb. Although not particularly limited, for example, the distance B1 is preferably larger than or equal to about $\frac{1}{100}$ of the resonant wavelength. Similarly, although not particularly limited, for example, the distance B2 is preferably larger than or equal to about $\frac{1}{100}$ of the resonant wavelength. The distances B1 and B2 in these cases can effectively shift the phase of the higher-order mode in the higher-order-mode resonance area, and thus can effectively reduce or prevent the higher-order mode.

As in the present preferred embodiment, when the first end portion La is located at the outer side of the first reflector 8 in the x direction, the upper limit of the distance between the first end portion La and the first reflector 8 is not particularly limited, but is preferably larger than or equal to about $\frac{1}{100}$ of the resonant wavelength. When the third end portion Ma is located at the outer side of the first reflector 8 in the x direction, the upper limit of the distance between the third end portion Ma and the first reflector 8 is not particularly limited, but is preferably larger than or equal to about $\frac{1}{100}$ of the resonant wavelength. In these cases, when the first end portion La and the third end portion Ma do not overlap in the y direction, the higher-order mode can be fully reduced or prevented, and the acoustic wave device 1 can have a compact size. Similarly, when the second end portion Lb is located at the outer side of the second reflector 9 in the x direction, the upper limit of the distance between the second end portion Lb and the second reflector 9 is not particularly limited, but is preferably larger than or equal to about $\frac{1}{100}$ of the resonant wavelength. When the fourth end portion Mb is located at the outer side of the second reflector 9 in the x direction, the upper limit of the distance between the fourth end portion Mb and the second reflector 9 is not particularly limited, but is preferably larger than or equal to about $\frac{1}{100}$ of the resonant wavelength. In these cases, when the second end portion Lb and the fourth end portion Mb do not overlap in the y direction, the higher-order mode can be fully reduced or prevented, and the acoustic wave device 1 can have a compact size.

Hereinbelow, first to fourth modified examples of the first preferred embodiment are described. The first to fourth modified examples differ from the first preferred embodiment only in the positions of the first acoustic-velocity adjuster L and the second acoustic-velocity adjuster M. As in the first preferred embodiment, the first to fourth modified examples can reduce or prevent the transverse mode and the higher-order mode.

Figure 6:
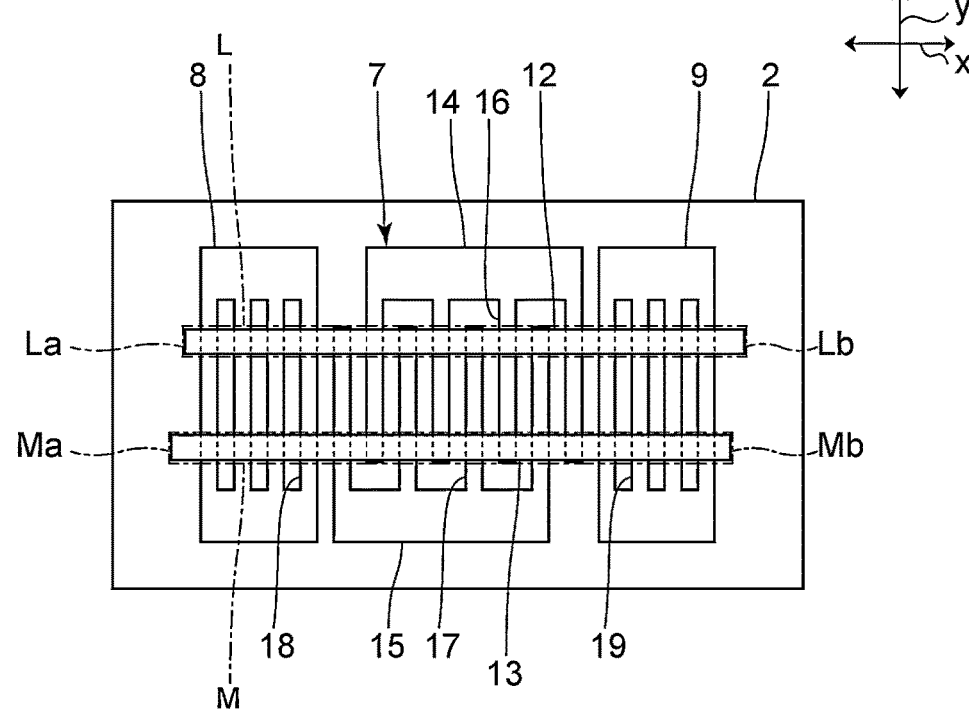
FIG. 6 is a plan view of an acoustic wave device according to a first modified example of the first preferred embodiment of the present invention.

In the first modified example illustrated in FIG. 6, the first end portion La is located at the inner side of the third end portion Ma in the x direction. On the other hand, the second end portion Lb is located at the outer side of the fourth end portion Mb in the x direction. In the present modified example, the first end portion La, the second end portion Lb, the third end portion Ma, and the fourth end portion Mb are located at the further sides of the pair of edge areas in the x direction.

In the present modified example, the length of the first acoustic-velocity adjuster L is equal or substantially equal to the length of the second acoustic-velocity adjuster M. The length of the first acoustic-velocity adjuster L may differ from the length of the second acoustic-velocity adjuster M.

Figure 7:
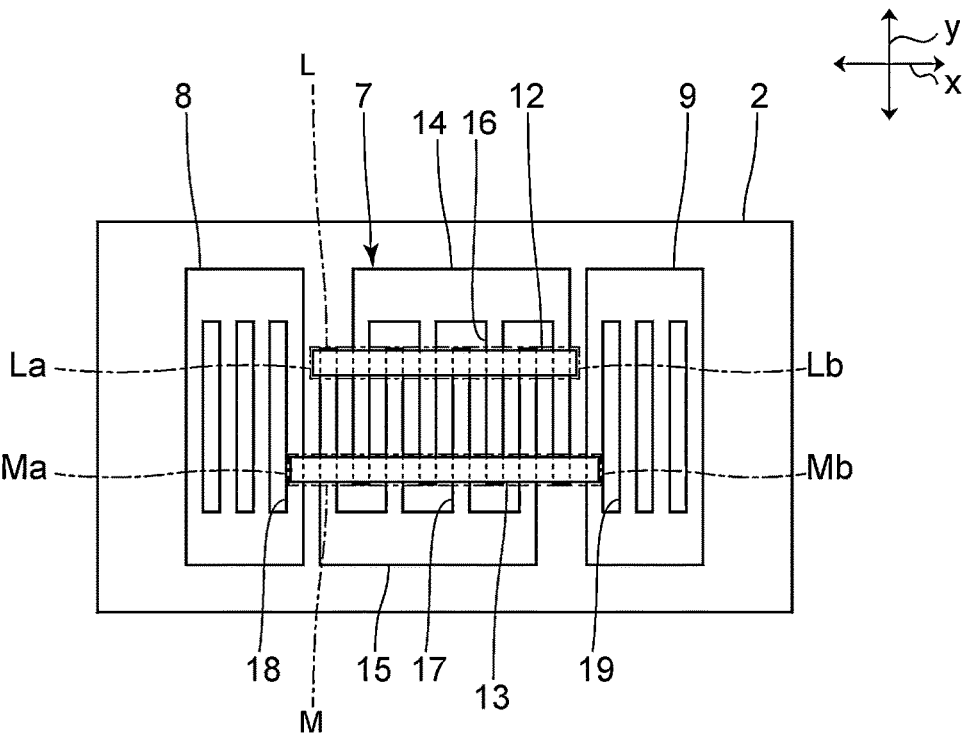
FIG. 7 is a plan view of an acoustic wave device according to a second modified example of the first preferred embodiment of the present invention.

In the second modified example illustrated in FIG. 7, the first end portion La is located between the IDT electrode 7 and the first reflector 8. The second end portion Lb is located between the IDT electrode 7 and the second reflector 9. The third end portion Ma is located on the electrode finger 18 of the first reflector 8 closest to the IDT electrode 7. The fourth end portion Mb is located on the electrode finger 19 of the second reflector 9 closest to the IDT electrode 7.

Figure 8:
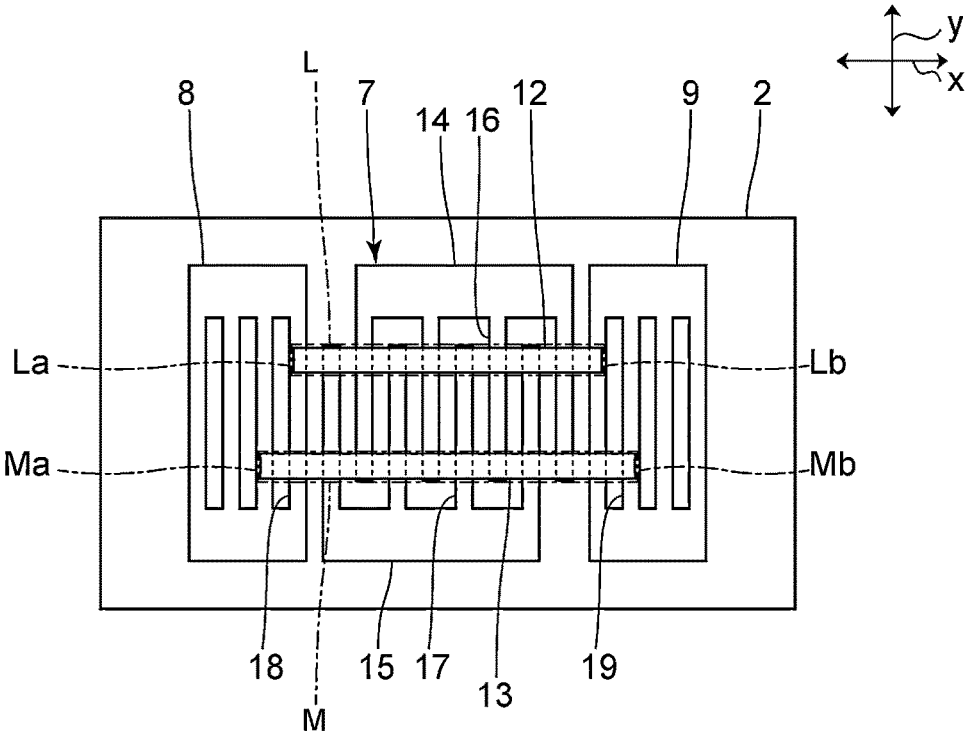
FIG. 8 is a plan view of an acoustic wave device according to a third modified example of the first preferred embodiment of the present invention.

In the third modified example illustrated in FIG. 8, the first end portion La and the third end portion Ma are respectively located on different electrode fingers 18 of the first reflector 8. More specifically, the first end portion La is located on one of the different electrode fingers 18 closer to the IDT electrode 7. The third end portion Ma is located on one of the different electrode fingers 18 farther from the IDT electrode 7.

The second end portion Lb and the fourth end portion Mb are located on different electrode fingers 19 of the second reflector 9. More specifically, the second end portion Lb is located on one of the different electrode fingers 19 closer to the IDT electrode 7. The fourth end portion Mb is located on one of the different electrode fingers 19 farther from the IDT electrode 7.

Figure 9:
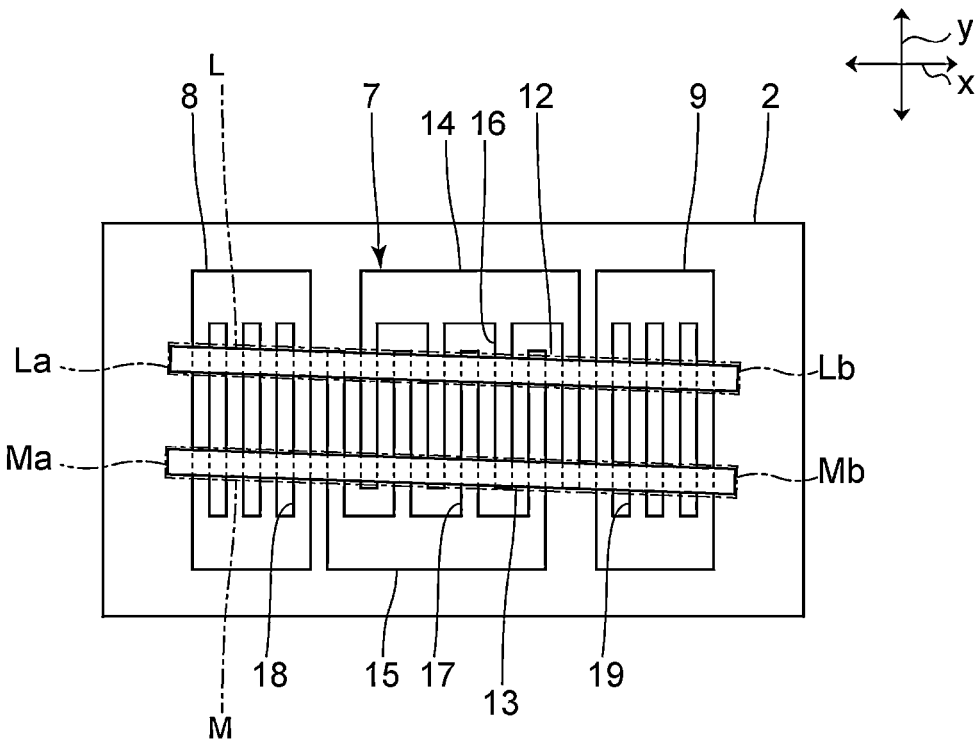
FIG. 9 is a plan view of an acoustic wave device according to a fourth modified example of the first preferred embodiment of the present invention.

In the fourth modified example illustrated in FIG. 9, the length of the first acoustic-velocity adjuster L is equal or substantially equal to the length of the second acoustic-velocity adjuster M. However, the mass loading film 12 and the mass loading film 13 extend with an inclination from the x direction. Thus, the direction in which the first acoustic-velocity adjuster L extends and the x direction cross each other. The direction in which the second acoustic-velocity adjuster M extends and the x direction cross each other. Thus, the first end portion La and the third end portion Ma do not overlap each other in the y direction, and the second end portion Lb and the fourth end portion Mb do not overlap each other in the y direction. In the present modified example, the first end portion La, the second end portion Lb, the third end portion Ma, and the fourth end portion Mb are located at the outer sides of the pair of edge areas in the x direction.

Also in the case where the first acoustic-velocity adjuster L and the second acoustic-velocity adjuster M extend with an inclination from the x direction, the length of the first acoustic-velocity adjuster L may differ from the length of the second acoustic-velocity adjuster M.

In the first preferred embodiment, the mass loading film 12 and the mass loading film 13 are directly disposed on the multiple electrode fingers of the IDT electrode 7, the first reflector 8, and the second reflector 9. Thus, a pair of acoustic-velocity adjusters are provided. However, this is not the only possible example. The following describes a fifth modified example and a sixth modified example of the first preferred embodiment that differ from the first preferred embodiment in the positions where the mass loading films are disposed. In a plan view, the positions where the mass loading films according to the fifth modified example and the sixth modified example are disposed are the same or substantially the same as the positions where the mass loading films according to the first preferred embodiment are disposed. Herein, a plan view is a view viewed from the top in FIG. 2. As in the first preferred embodiment, the fifth modified example and the sixth modified example can also reduce or prevent the transverse mode and the higher-order mode.

Figure 10:
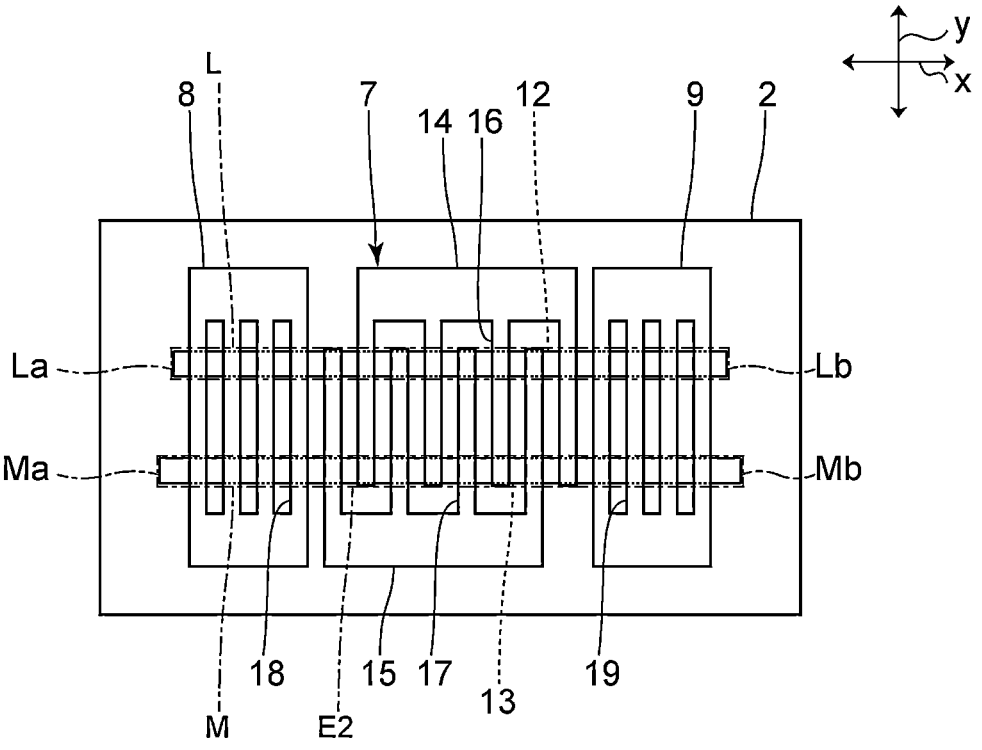
FIG. 10 is a plan view of an acoustic wave device according to a fifth modified example of the first preferred embodiment of the present invention.

In the fifth modified example illustrated in FIG. 10, the mass loading film 12 and the mass loading film 13 are disposed between the multiple electrode fingers of the IDT electrode 7, the first reflector 8, and the second reflector 9, and the piezoelectric substrate 2. The mass loading film 12 and the mass loading film 13 are also disposed on the piezoelectric substrate 2 at portions between the multiple electrode fingers, a portion between the IDT electrode 7 and the first reflector 8, and a portion between the IDT electrode 7 and the second reflector 9.

Figure 11:
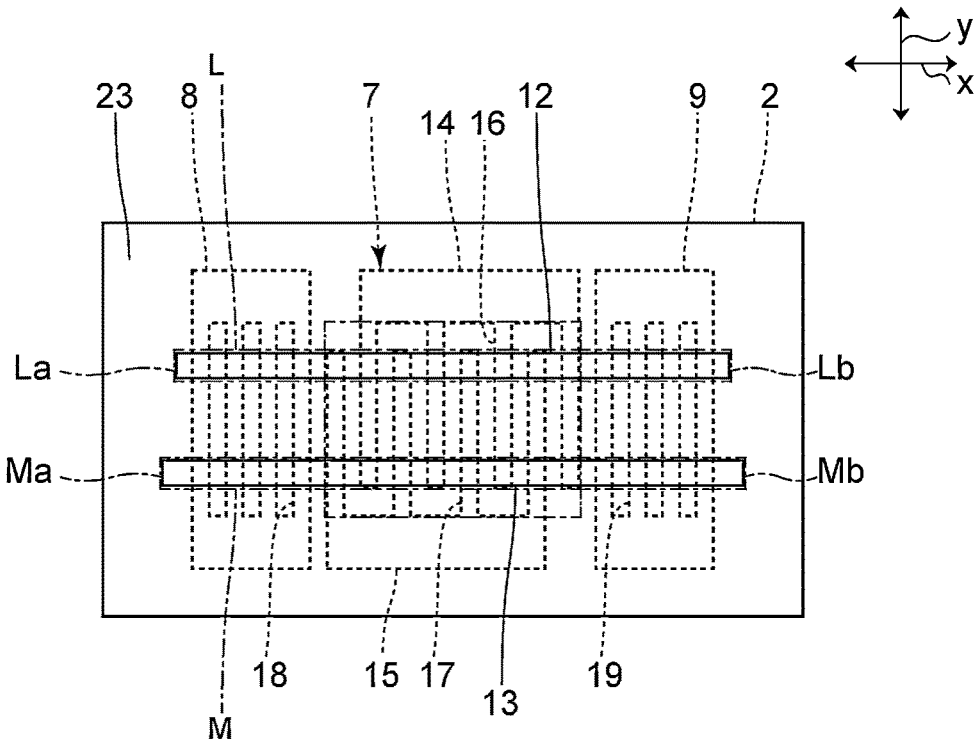
FIG. 11 is a plan view of an acoustic wave device according to a sixth modified example of the first preferred embodiment of the present invention.

In the sixth modified example illustrated in FIG. 11, a protective film 23 is disposed on the piezoelectric substrate 2 to cover the IDT electrode 7, the first reflector 8, and the second reflector 9. The mass loading film 12 and the mass loading film 13 are disposed on the protective film 23.

Referring back to FIG. 2, in the piezoelectric substrate 2 according to the first preferred embodiment, the piezoelectric layer 6 is indirectly disposed on the high acoustic-velocity film 4 with the low acoustic-velocity film 5 interposed therebetween. However, the structure of the piezoelectric substrate 2 is not limited to the above. Seventh to ninth modified examples of the first preferred embodiment that differ from the first preferred embodiment only in the structure of the piezoelectric substrate will be described below. As in the first preferred embodiment, the seventh to ninth modified examples can also reduce or prevent the transverse mode and the higher-order mode. In addition, the energy of the acoustic wave can be effectively trapped in the piezoelectric layer 6.

Figure 12:
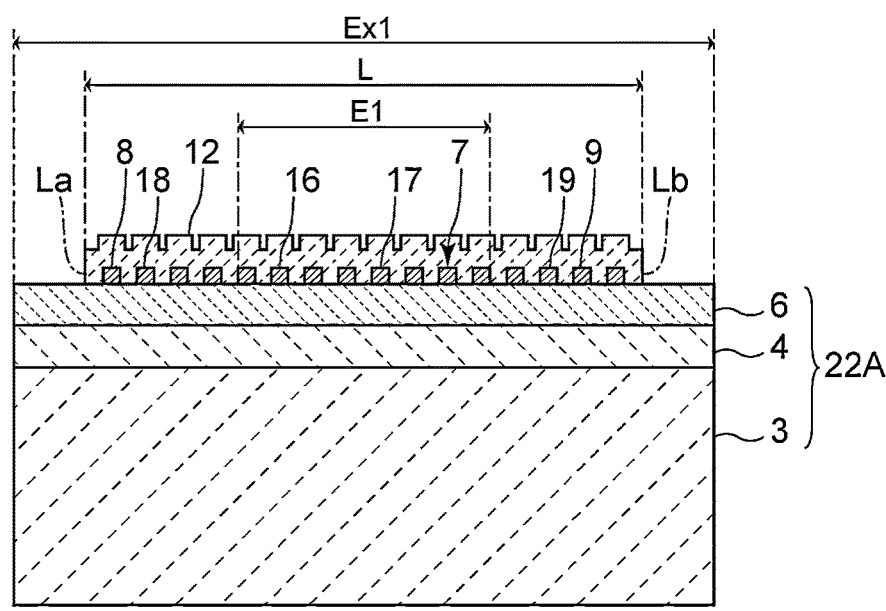
FIG. 12 is a cross-sectional view of an acoustic wave device according to a seventh modified example of the first preferred embodiment of the present invention, taken along a first expansion edge area.

In the seventh modified example illustrated in FIG. 12, a piezoelectric substrate 22A includes the support substrate 3, the high acoustic-velocity film 4, and the piezoelectric layer 6. In the present modified example, the piezoelectric layer 6 is directly disposed on the high acoustic-velocity film 4 defining and functioning as a high acoustic-velocity material layer.

Figure 13:
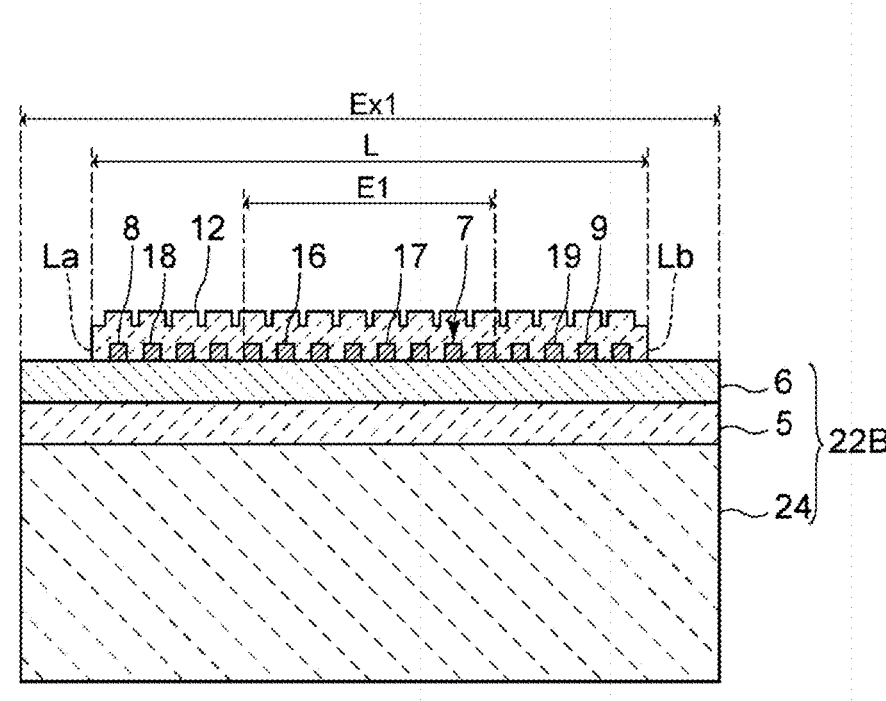
FIG. 13 is a cross-sectional view of an acoustic wave device according to an eighth modified example of the first preferred embodiment of the present invention, taken along the first expansion edge area.

In the eighth modified example illustrated in FIG. 13, a high acoustic-velocity support substrate 24 defines and functions as a high acoustic-velocity material layer. A piezoelectric substrate 22B includes the high acoustic-velocity support substrate 24, the low acoustic-velocity film 5, and the piezoelectric layer 6. The low acoustic-velocity film 5 is disposed on the high acoustic-velocity support substrate 24. The piezoelectric layer 6 is disposed on the low acoustic-velocity film 5.

Examples of the material of the high acoustic-velocity support substrate 24 include a medium including a material, as a main component, such as an aluminum oxide, a silicon carbide, a silicon nitride, a silicon oxynitride, silicon, sapphire, a lithium tantalate, a lithium niobate, a quartz, alumina, zirconia, cordierite, mullite, steatite, forsterite, magnesia, a DLC film, or diamond.

Figure 14:
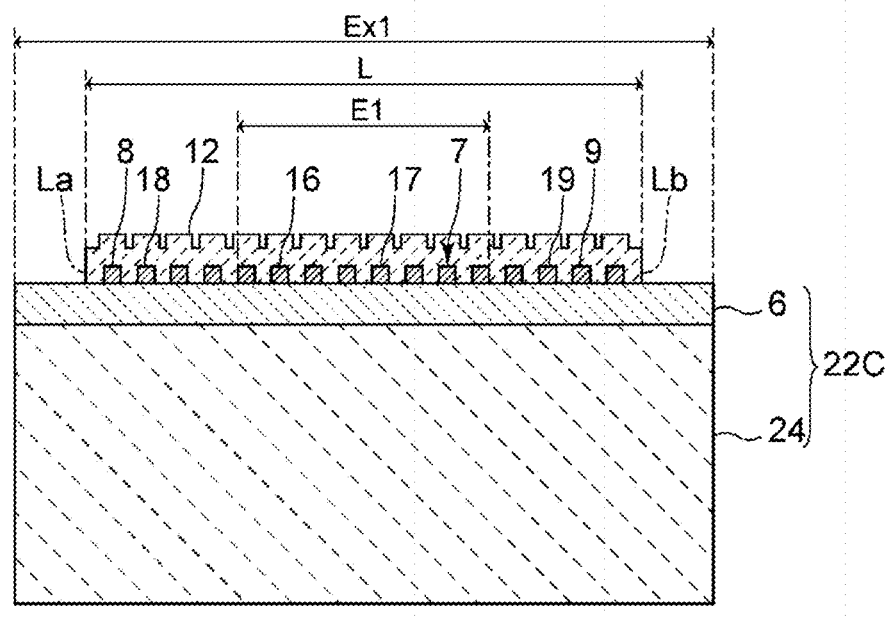
FIG. 14 is a cross-sectional view of an acoustic wave device according to a ninth modified example of the first preferred embodiment of the present invention, taken along the first expansion edge area.

In the ninth modified example illustrated in FIG. 14, a piezoelectric substrate 22C includes the high acoustic-velocity support substrate 24 and the piezoelectric layer 6. In the present modified example, the piezoelectric layer 6 is directly disposed on the high acoustic-velocity support substrate 24 defining and functioning as the high acoustic-velocity material layer.

Figures 15, 16:
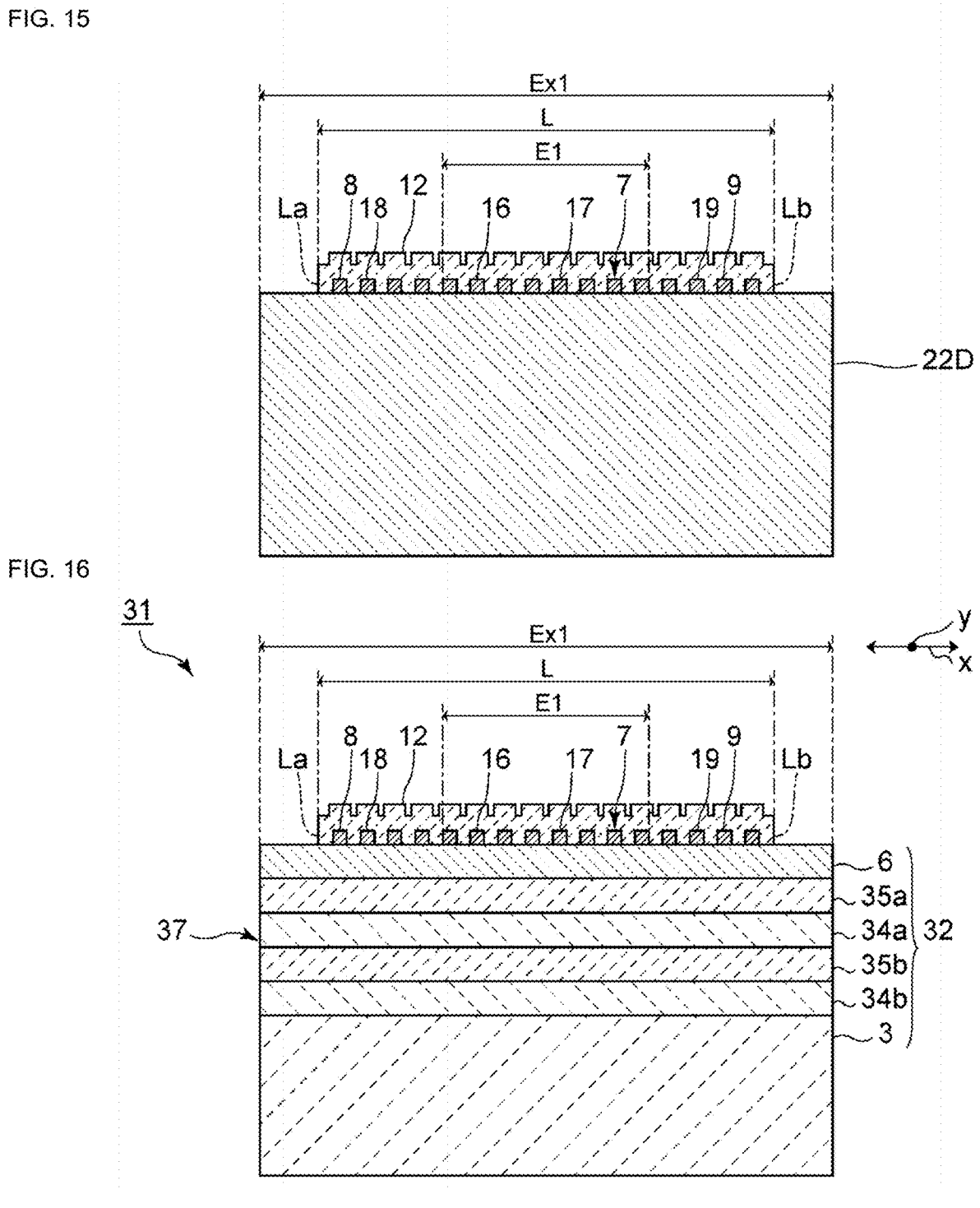
FIG. 15 is a cross-sectional view of an acoustic wave device according to a tenth modified example of the first preferred embodiment of the present invention, taken along the first expansion edge area.
FIG. 16 is a cross-sectional view of an acoustic wave device according to a second preferred embodiment of the present invention, taken along the first expansion edge area.

On the other hand, in the tenth modified example of the first preferred embodiment illustrated in FIG. 15, a piezoelectric substrate 22D includes only a piezoelectric layer. The piezoelectric substrate 22D is a piezoelectric substrate. As in the first preferred embodiment, this structure can also reduce or prevent the transverse mode and the higher-order mode.

FIG. 16 is a cross-sectional view of an acoustic wave device according to a second preferred embodiment of the present invention, taken along the first expansion edge area.

The present preferred embodiment differs from the first preferred embodiment in that a piezoelectric substrate 32 includes an acoustic reflection film 37. More specifically, the piezoelectric substrate 32 includes the support substrate 3, the acoustic reflection film 37, and the piezoelectric layer 6. The acoustic reflection film 37 is disposed on the support substrate 3. The piezoelectric layer 6 is disposed on the acoustic reflection film 37. Except for the above points, an acoustic wave device 31 according to the present preferred embodiment has the same or substantially the same structure as the acoustic wave device 1 according to the first preferred embodiment.

The acoustic reflection film 37 includes a multilayer body including multiple acoustic impedance layers. More specifically, the acoustic reflection film 37 includes multiple low-acoustic impedance layers and multiple high-acoustic impedance layers. The low-acoustic impedance layers have a relatively low-acoustic impedance. The multiple low-acoustic impedance layers of the acoustic reflection film 37 include a low-acoustic impedance layer 35a and a low-acoustic impedance layer 35b. On the other hand, the high-acoustic impedance layers have a relatively high-acoustic impedance. The multiple high-acoustic impedance layers of the acoustic reflection film 37 include a high-acoustic impedance layer 34a and a high-acoustic imped-ance layer 34b. The low-acoustic impedance layers and the high-acoustic impedance layer are alternately laminated. In the acoustic reflection film 37, the low-acoustic impedance layer 35a is located closest to the piezoelectric layer 6.

The acoustic reflection film 37 includes, for example, two low-acoustic impedance layers and two high-acoustic impedance layers. Instead, the acoustic reflection film 37 may include at least one low-acoustic impedance layer and at least one high-acoustic impedance layer.

Examples usable as the material of the low-acoustic impedance layer include a silicon oxide and aluminum. Examples usable as the material of the high-acoustic imped-ance layer include metal such as platinum or tungsten and dielectric materials such as an aluminum nitride or a silicon nitride.

The acoustic wave device 31 includes the acoustic reflec-tion film 37, and thus can effectively trap the energy of the acoustic wave in the piezoelectric layer 6.

The structure of the electrode on the piezoelectric sub-strate 32 according to the present preferred embodiment is the same or substantially the same as that according to the first preferred embodiment. Thus, the present preferred embodiment can establish the piston mode and reduce or prevent the transverse mode. In addition, as in the first preferred embodiment, the present preferred embodiment can shift the phase of the higher-order mode in the higher-order-mode resonance area. The present preferred embodi-ment can thus reduce or prevent the resonance of the higher-order mode, and reduce or prevent the higher-order mode besides the transverse mode.

Figure 17:
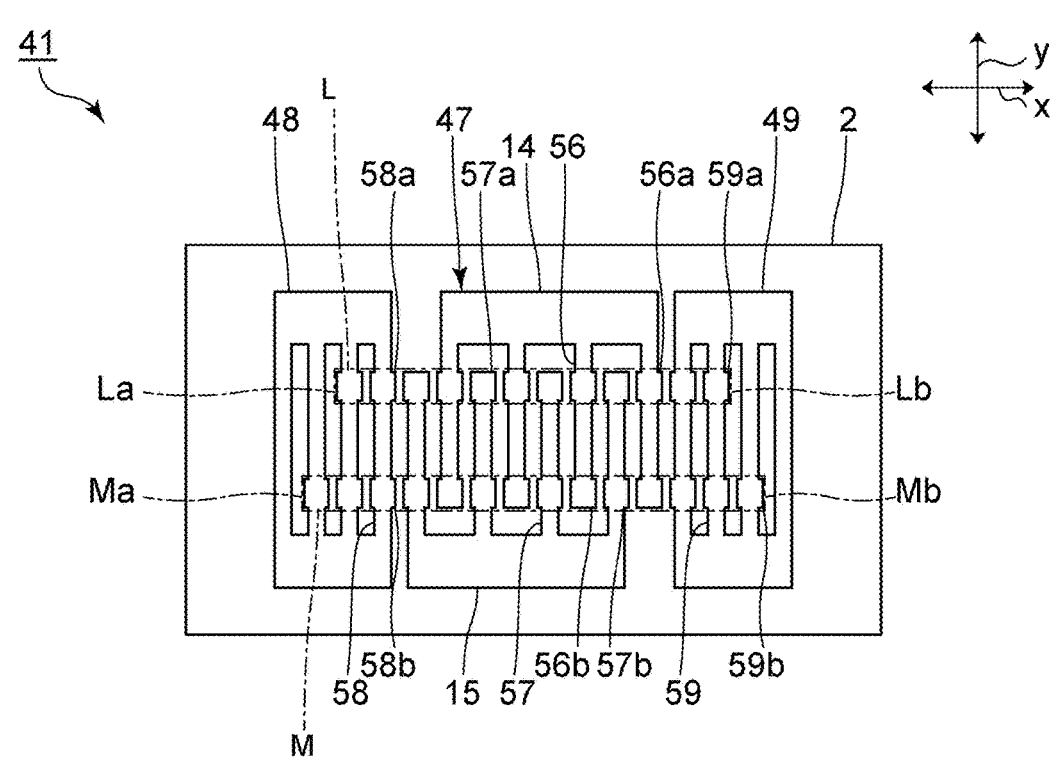
FIG. 17 is a plan view of an acoustic wave device according to a third preferred embodiment of the present invention.

FIG. 17 is a plan view of an acoustic wave device according to a third preferred embodiment of the present invention. Although not denoted with reference signs in FIG. 17, as in the cases of the first preferred embodiment and the second preferred embodiment, an acoustic wave device 41 includes the first expansion edge area Ex1, the second expansion edge area Ex2, and the expansion center area Cx.

The present preferred embodiment differs from the first preferred embodiment in the structure and arrangement of the pair of acoustic-velocity adjusters. Except for the above points, the acoustic wave device 41 according to the present preferred embodiment has the same or substantially the same structure as the acoustic wave device 1 according to the first preferred embodiment.

Multiple electrode fingers of an IDT electrode 47, a first reflector 48, and a second reflector 49 include wide portions to define the pair of acoustic-velocity adjusters. More spe-cifically, the width of the electrode fingers in the wide portions is larger than the width of the electrode fingers in the expansion center area Cx. Thus, the acoustic velocity in the pair of acoustic-velocity adjusters is lower than the acoustic velocity in the expansion center area Cx. The structure of the present preferred embodiment will be described below in detail.

The multiple electrode fingers of the IDT electrode 47 include wide portions in the first edge area E1 and the second edge area E2. More specifically, multiple first elec-trode fingers 56 include wide portions 56a in the first edge area E1. The multiple first electrode fingers 56 include wide portions 56b in the second edge area E2. Similarly, multiple second electrode fingers 57 include wide portions 57a in the first edge area E1. The multiple second electrode fingers 57 include wide portions 57b in the second edge area E2. In the present preferred embodiment, all of the electrode fingers of the IDT electrode 47 include wide portions. Instead, not all of the electrode fingers of the IDT electrode 47 necessarily include wide portions.

In this case, in the acoustic wave device 41, the first end portion La of the first acoustic-velocity adjuster L is located at the inner side of the third end portion Ma of the second acoustic-velocity adjuster M in the x direction. The first end portion La and the third end portion Ma are located on the first reflector 48. More specifically, multiple electrode fin-gers 58 of the first reflector 48 include wide portions 58a in the first expansion edge area Ex1. The first end portion La of the first acoustic-velocity adjuster L is an end portion, farther from the IDT electrode 47, of one of the wide portions 58a farthest from the IDT electrode 47. The mul-tiple electrode fingers 58 of the first reflector 48 include wide portions 58b in the second expansion edge area Ex2. The third end portion Ma of the second acoustic-velocity adjuster M is an end portion, farther from the IDT electrode 47, of one of the wide portions 58b farthest from the IDT electrode 47. The electrode finger 58 where the third end portion Ma is located does not include the wide portion 58a.

In the acoustic wave device 41, multiple electrode fingers 58 successive from the electrode finger 58 of the first reflector 48 closest to the IDT electrode 47 include both of the wide portion 58a and the wide portion 58b. The electrode finger 58 farther from the IDT electrode 47 than the suc-cessive electrode fingers 58 only includes the wide portion 58b among the wide portion 58a and the wide portion 58b. The arrangement of the wide portions 58a and the wide portions 58b is not limited to the above. When the third end portion Ma is located at the outer side of the first end portion La in the x direction, the wide portion 58b where the third end portion Ma is located may be located at any position at the outer side of, in the x direction, the wide portion 58a where the first end portion La is located. When the first end portion La is located at the outer side of the third end portion Ma in the x direction, the wide portion 58a where the first end portion La is located may be located at any position at the outer side of, in the x direction, the wide portion 58b where the third end portion Ma is located. At least one electrode finger 58 may include the wide portion 58a. At least one electrode finger 58 may include the wide portion 58b.

As illustrated in FIG. 17, the second end portion Lb of the first acoustic-velocity adjuster L is located at the inner side of the fourth end portion Mb of the second acoustic-velocity adjuster M in the x direction. The second end portion Lb and the fourth end portion Mb are disposed on the second reflector 49. More specifically, multiple electrode fingers 59 of the second reflector 49 include wide portions 59a in the first expansion edge area Ex1. The second end portion Lb of the first acoustic-velocity adjuster L is an end portion, farther from the IDT electrode 47, of one of the wide portions 59a farthest from the IDT electrode 47. The multiple electrode fingers 59 of the second reflector 49 include wide portions 59b in the second expansion edge area Ex2. The fourth end portion Mb of the second acoustic-velocity adjuster M is the end portion, farther from the IDT electrode 47, of one of the wide portions 59b farthest from the IDT electrode 47. The electrode finger 59 where the fourth end portion Mb is located does not include the wide portion 59a.

In the acoustic wave device 41, multiple electrode fingers 59 successive from the electrode finger 59 of the second reflector 49 closest to the IDT electrode 47 include both of the wide portion 59a and the wide portion 59b. The electrode finger 59 farther from the IDT electrode 47 than the successive electrode fingers 59 only includes the wide portion 59b among the wide portion 59a and the wide portion 59b. The arrangement of the wide portions 59a and the wide portions 59b is not limited to the above. When the fourth end portion Mb is located at the outer side of the second end portion Lb in the x direction, the wide portion 59b where the fourth end portion Mb is located may be located at any position at the outer side of, in the x direction, the wide portion 59a where the second end portion Lb is located. When the second end portion Lb is located at the outer side of the fourth end portion Mb in the x direction, the wide portion 59a where the second end portion Lb is located may be located at any position at the outer side of, in the x direction, the wide portion 59b where the fourth end portion Mb is located. At least one electrode finger 59 may include the wide portion 59a. At least one electrode finger 59 may include the wide portion 59b.

As in the first preferred embodiment, in the present preferred embodiment, the areas are arranged in the y direction in order of the center area C, the pair of acoustic-velocity adjusters, and the pair of high acoustic-velocity areas. This structure can thus establish the piston mode, and reduce or prevent the transverse mode.

In addition, the first end portion La and the third end portion Ma do not overlap in the y direction, and the second end portion Lb and the fourth end portion Mb do not overlap in the y direction. Thus, the phase of the higher-order mode in the higher-order-mode resonance area can be shifted. Resonance in the higher-order mode can thus be reduced or prevented. Thus, the acoustic wave device 41 can reduce or prevent the higher-order mode in addition to the transverse mode.

Also when the multiple electrode fingers of the IDT electrode 47, the first reflector 48, and the second reflector 49 include wide portions, for example, the mass loading films may be provided on the multiple electrode fingers. The pair of acoustic-velocity adjusters may be defined by the wide portions and the mass loading films.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a piezoelectric substrate;
   an interdigital transducer (IDT) electrode on the piezoelectric substrate and including a plurality of electrode fingers; and
   a first reflector and a second reflector on the piezoelectric substrate on both sides of the IDT electrode in an acoustic-wave propagation direction; wherein
   a portion of the IDT electrode at which each two of the plurality of electrode fingers adjacent to each other overlap in the acoustic-wave propagation direction defines an intersecting area, and the intersecting area includes a center area at or around a center portion in a direction in which the plurality of electrode fingers extend, and a pair of edge areas on both sides of the center area in the direction in which the plurality of electrode fingers extend;
   areas including the pair of edge areas and overlapping the pair of edge areas in the acoustic-wave propagation direction define a pair of expansion edge areas;
   a pair of acoustic-velocity adjusters are provided in the pair of expansion edge areas, and an acoustic velocity in the pair of acoustic-velocity adjusters is lower than an acoustic velocity in the center area;
   one acoustic-velocity adjuster of the pair of acoustic-velocity adjusters includes a first end portion located closer to the first reflector and a second end portion located closer to the second reflector, and another acoustic-velocity adjuster of the pair of acoustic-velocity adjusters includes a third end portion located closer to the first reflector and a fourth end portion located closer to the second reflector;
   the first end portion, the second end portion, the third end portion, and the fourth end portion are located at outer sides of the pair of edge areas in the acoustic-wave propagation direction;
   end portions in at least one of two pairs including a pair of the first end portion and the third end portion and a pair of the second end portion and the fourth end portion do not overlap each other in the direction in which the plurality of electrode fingers extend;
   the pair of acoustic-velocity adjusters extend to outer sides of the first reflector and the second reflector in the acoustic-wave propagation direction;
   a direction in which the pair of acoustic-velocity adjusters extend and the acoustic-wave propagation direction are parallel or substantially parallel to each other; and
   the pair of acoustic-velocity adjusters are each defined by a mass loading film.

2. The acoustic wave device according to claim 1, wherein
   a pair of high acoustic-velocity areas are provided at outer sides of the pair of edge areas in the direction in which the plurality of electrode fingers extend; and
   an acoustic velocity in the pair of high acoustic-velocity areas is higher than an acoustic velocity in the center area.

3. The acoustic wave device according to claim 1, wherein the first end portion and the third end portion do not overlap each other in the direction in which the plurality of electrode fingers extend, and the second end portion and the fourth end portion do not overlap each other in the direction in which the plurality of electrode fingers extend.

4. The acoustic wave device according to claim 1, wherein
   an area including the center area and overlapping the center area in the acoustic-wave propagation direction is an expansion center area;

the first reflector and the second reflector respectively include a plurality of electrode fingers; and the pair of acoustic-velocity adjusters are each defined by widened portions in the plurality of electrode fingers in the IDT electrode, the plurality of electrode fingers in the first reflector, and the plurality of electrode fingers in the second reflector, the widened portions being wider than the expansion center area.

5. The acoustic wave device according to claim 1, wherein the piezoelectric substrate includes a high acoustic-velocity material layer, and a piezoelectric layer directly or indirectly on the high acoustic-velocity material layer; and an acoustic velocity of a bulk wave that propagates through the high acoustic-velocity material layer is higher than an acoustic velocity of an acoustic wave that propagates through the piezoelectric layer.

6. The acoustic wave device according to claim 5, wherein the piezoelectric substrate includes a low acoustic-velocity film between the high acoustic-velocity material layer and the piezoelectric layer; and an acoustic velocity of a bulk wave that propagates through the low acoustic-velocity film is lower than an acoustic velocity of a bulk wave that propagates through the piezoelectric layer.

7. The acoustic wave device according to claim 5, wherein the high acoustic-velocity material layer is a high acoustic-velocity support substrate.

8. The acoustic wave device according to claim 5, wherein the piezoelectric substrate includes a support substrate; and the high acoustic-velocity material layer is a high acoustic-velocity film on the support substrate.

9. The acoustic wave device according to claim 1, wherein the piezoelectric substrate includes an acoustic reflection film and a piezoelectric layer on the acoustic reflection film;

the acoustic reflection film includes a high-acoustic impedance layer with a relatively high-acoustic impedance and a low-acoustic impedance layer with a relatively low-acoustic impedance; and the high-acoustic impedance layer and the low-acoustic impedance layer are alternately laminated.

10. The acoustic wave device according to claim 2, wherein the first end portion and the third end portion do not overlap each other in the direction in which the plurality of electrode fingers extend, and the second end portion and the fourth end portion do not overlap each other in the direction in which the plurality of electrode fingers extend.

11. The acoustic wave device according to claim 2, wherein an area including the center area and overlapping the center area in the acoustic-wave propagation direction is an expansion center area;

the first reflector and the second reflector respectively include a plurality of electrode fingers; and the pair of acoustic-velocity adjusters are each defined by forming wide portions in the plurality of electrode fingers in the IDT electrode, the plurality of electrode fingers in the first reflector, and the plurality of electrode fingers in the second reflector, the wide portions being wider than the expansion center area.

12. The acoustic wave device according to claim 2, wherein the piezoelectric substrate includes a high acoustic-velocity material layer, and a piezoelectric layer directly or indirectly on the high acoustic-velocity material layer; and an acoustic velocity of a bulk wave that propagates through the high acoustic-velocity material layer is higher than an acoustic velocity of an acoustic wave that propagates through the piezoelectric layer.

13. An acoustic wave device, comprising:

a piezoelectric substrate;

an interdigital transducer (IDT) electrode on the piezoelectric substrate and including a plurality of electrode fingers; and a first reflector and a second reflector on the piezoelectric substrate on both sides of the IDT electrode in an acoustic-wave propagation direction; wherein a portion of the IDT electrode at which each two of the plurality of electrode fingers adjacent to each other overlap in the acoustic-wave propagation direction defines an intersecting area, and the intersecting area includes a center area at or around a center portion in a direction in which the plurality of electrode fingers extend, and a pair of edge areas on both sides of the center area in the direction in which the plurality of electrode fingers extend;

areas including the pair of edge areas and overlapping the pair of edge areas in the acoustic-wave propagation direction define a pair of expansion edge areas;

a pair of acoustic-velocity adjusters are provided in the pair of expansion edge areas, and an acoustic velocity in the pair of acoustic-velocity adjusters is lower than an acoustic velocity in the center area;

one acoustic-velocity adjuster of the pair of acoustic-velocity adjusters includes a first end portion located closer to the first reflector and a second end portion located closer to the second reflector, and another acoustic-velocity adjuster of the pair of acoustic-velocity adjusters includes a third end portion located closer to the first reflector and a fourth end portion located closer to the second reflector;

the first end portion, the second end portion, the third end portion, and the fourth end portion are located at outer sides of the pair of edge areas in the acoustic-wave propagation direction;

end portions in at least one of two pairs including a pair of the first end portion and the third end portion and a pair of the second end portion and the fourth end portion do not overlap each other in the direction in which the plurality of electrode fingers extend; and a direction in which the pair of acoustic-velocity adjusters extend and the acoustic-wave propagation direction cross each other.

\* \* \* \* \*